United States Patent [19]

Hofmeister et al.

[11] Patent Number: 4,723,196

[45] Date of Patent: Feb. 2, 1988

[54] ELECTRICAL CIRCUIT UNIT WITH MOISTURE SEALED PLUG-IN CONNECTORS

[75] Inventors: Werner Hofmeister, Mühlacker; Dieter Neuhaus, Sulzbach, both of Fed. Rep. of Germany

[73] Assignee: Robert Bosch GmbH, Stuttgart, Fed. Rep. of Germany

[21] Appl. No.: 785,446

[22] Filed: Oct. 8, 1985

[30] Foreign Application Priority Data

Oct. 17, 1984 [DE] Fed. Rep. of Germany ....... 3437988

[51] Int. Cl.[4] .............................................. H05K 5/00
[52] U.S. Cl. ................................... 361/399; 174/52 S; 361/395; 439/75; 439/76; 439/595
[58] Field of Search ............... 174/52 S; 339/17 LC, 339/217 S, 206 R; 361/395, 399, 413, 424

[56] References Cited

U.S. PATENT DOCUMENTS 3,904,812 9/1975 Daffron ........................ 174/52 S
4,196,467 4/1980 Jakob et al. ................... 361/399
4,379,606 4/1983 Clark et al. .................. 339/206 R
4,409,641 10/1983 Jakob et al. .................. 361/386
4,491,376 1/1985 Gladd et al. ................. 339/17 LC
4,602,839 7/1986 Winger ....................... 339/206 R Primary Examiner—J. R. Scott
Assistant Examiner—Gregory D. Thompson
Attorney, Agent, or Firm—Frishauf, Holtz, Goodman & Woodward

[57] ABSTRACT

By a special structure the conductor paths between connection prongs at one end of an electric circuit unit and circuit components located on two circuit boards are greatly shortened. The circuit boards are connected at their ends remote from the connector prongs by studs that releasably snap together while a flexible flat conductor makes connections between the two circuit boards. The two circuit boards are electrically and mechanically connected with separable parts of a plug connector each carrying at least one row of prongs projecting into a plug-in space of a receptacle body. One of these separable parts is integrated into a receptable body, which is provided with an aperture through which the other plug connector part can be slipped and locked into place after the boards have been electrically connected together at their far ends and the circuits have been checked.

11 Claims, 6 Drawing Figures

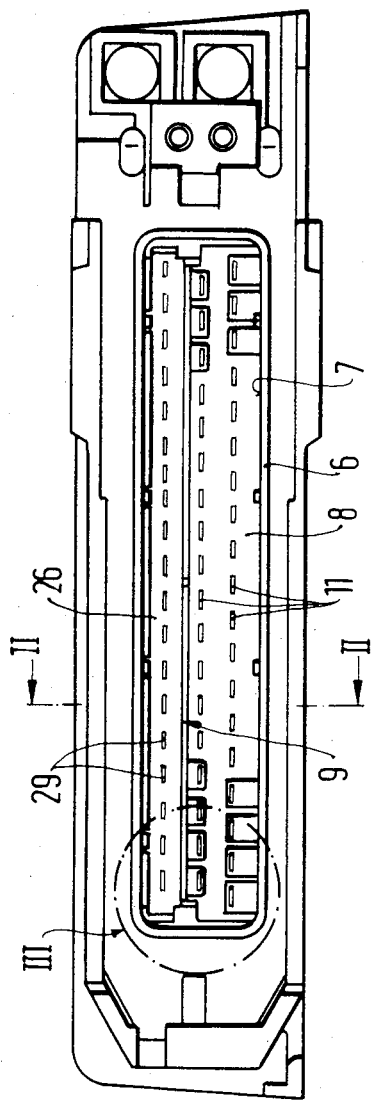
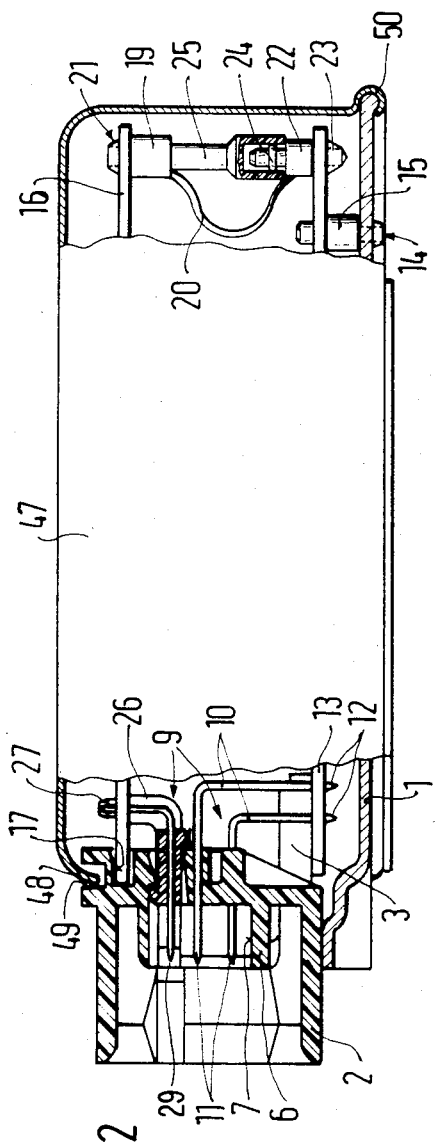
FIG. 1
FIG. 2

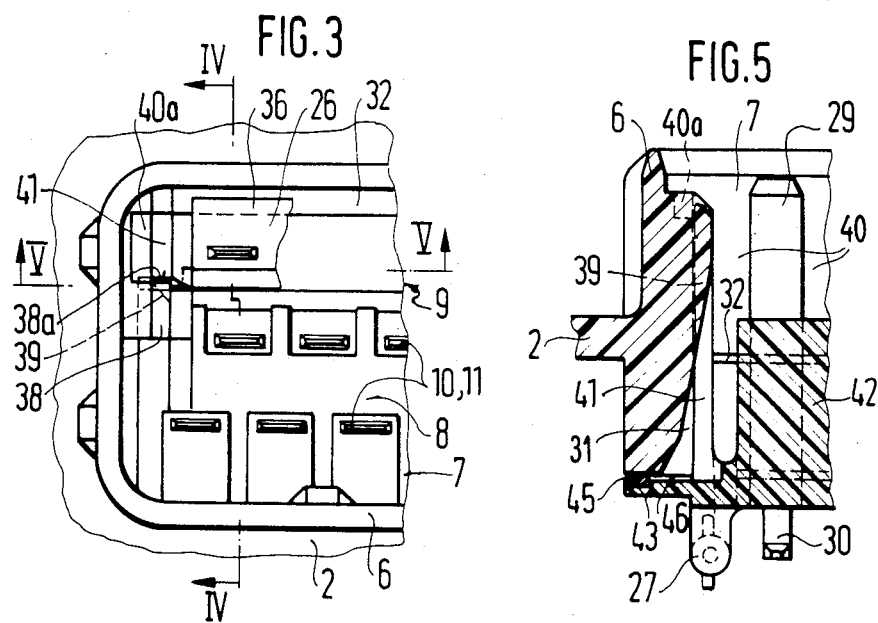
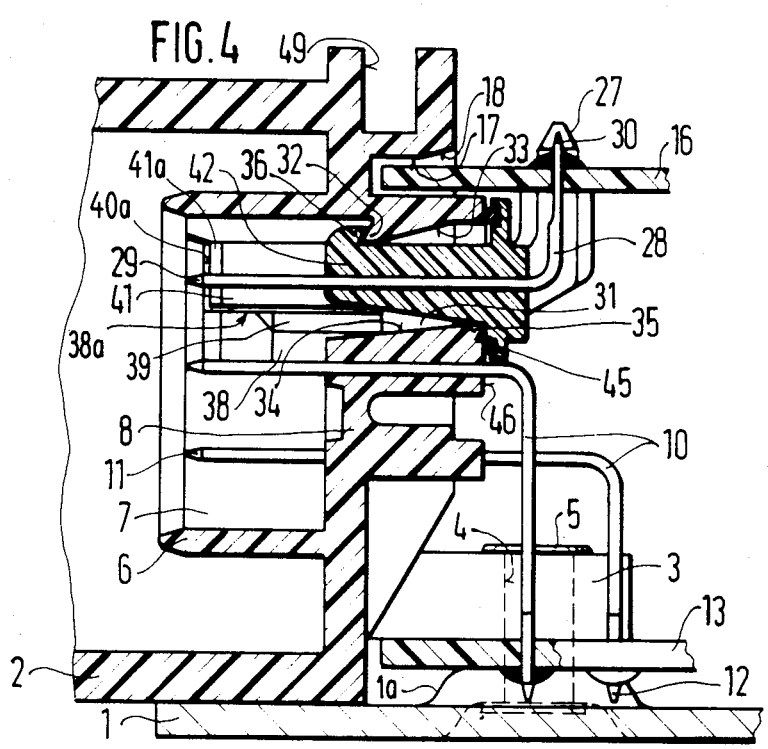

ELECTRICAL CIRCUIT UNIT WITH MOISTURE SEALED PLUG-IN CONNECTORS

This invention concerns electric circuit units comprising at least two circuit boards and a casing holding sealed plug-in connector prongs leading outside of the casing.

Countless circuits units incorporating at least two circuit boards are known. When such units are also equipped with plug-in connectors, the connector prongs are held together in rows in an elongated insulating plug body mounted on one of the circuit boards. The plug-in portion of the plug body protrudes out of the casing in a manner that provides a seal against moisture and dirt. The plug-in portion projecting out of the casing can be connected to a mating connector which is usually crimped on a wiring harness or cable so that the mating connector is movable for making the connection.

The electrical/electronic components disposed on the circuit boards of such a circuit unit are connected to the connection pins or tongues of the connector prongs. The wiring harness equipped with the mating connector engageable with the plug-in portion of the circuit unit extends the connections of the circuit board components of the circuit unit over to other circuit aggregates which are controllable or modifiable in their function, for example ignition, motronic or brake anti-lock systems of a motor vehicle.

In the known circuit units having two or more circuit-boards, however, there is the disadvantage that long circuit paths on the circuit boards are needed for connections and accordingly much space is needed for their accommodation on the circuit boards. In order to accomplish the connection of the connector tongues of a plug-in connector part, which is mounted on only one of the circuit boards of the unit, over to corresponding components on another circuit board within the same circuit unit, the conducting paths must first extend across a portion of the first circuit board and then continue through additional circuit board connectors to the other of the circuit boards, and then continue on that other circuit board to components located thereon.

SUMMARY OF THE INVENTION

It is an object of the present invention to shorten the conducting paths required on the circuit boards and to reduce the number of circuit board connectors.

Briefly, a divided plug body is used in the circuit unit so that each of the plug body parts can be plugged into the mating plug connection parts related thereto at the same time. Each plug body part is mounted on one of the circuit boards which carries all the components which are to be connected thereby. In this way the apparatus as a whole can be made smaller and at lower cost. There is the further advantage that the unit is less vulnerable to disturbing electromagnetic fields.

It is particularly useful for the parts of the plug body to be releasably connected with each other, or at least that there be a releasable connection of one part with another part that receives it. That makes for simple and economical assembly. In addition, the parts of the plug body can be sealed against each other in order to make an arrangement for sealing out moisture and dirt, through which the likewise sealed plug connection prongs lead outward from the casing of the circuit unit.

BRIEF DESCRIPTION OF THE DRAWINGS

The invention is further described by way of illustrative example with reference to the annexed drawings, in which:

FIG. 1 is a front view illustrating the plug-in region of an electrical circuit unit;

FIG. 2 is a partial sectional view along the line II—II of FIG. 1 of the electrical circuit unit;

FIG. 3 is a detailed view at III in FIG. 1 on a magnified scale;

FIG. 4 is a sectional view along the line IV—IV of FIG. 3 of an embodiment having a modification compared with FIG. 2;

FIG. 5 is a sectional view along the line V—V of FIG. 3, and

DESCRIPTION OF THE ILLUSTRATED EMBODIMENT

Figure 6:
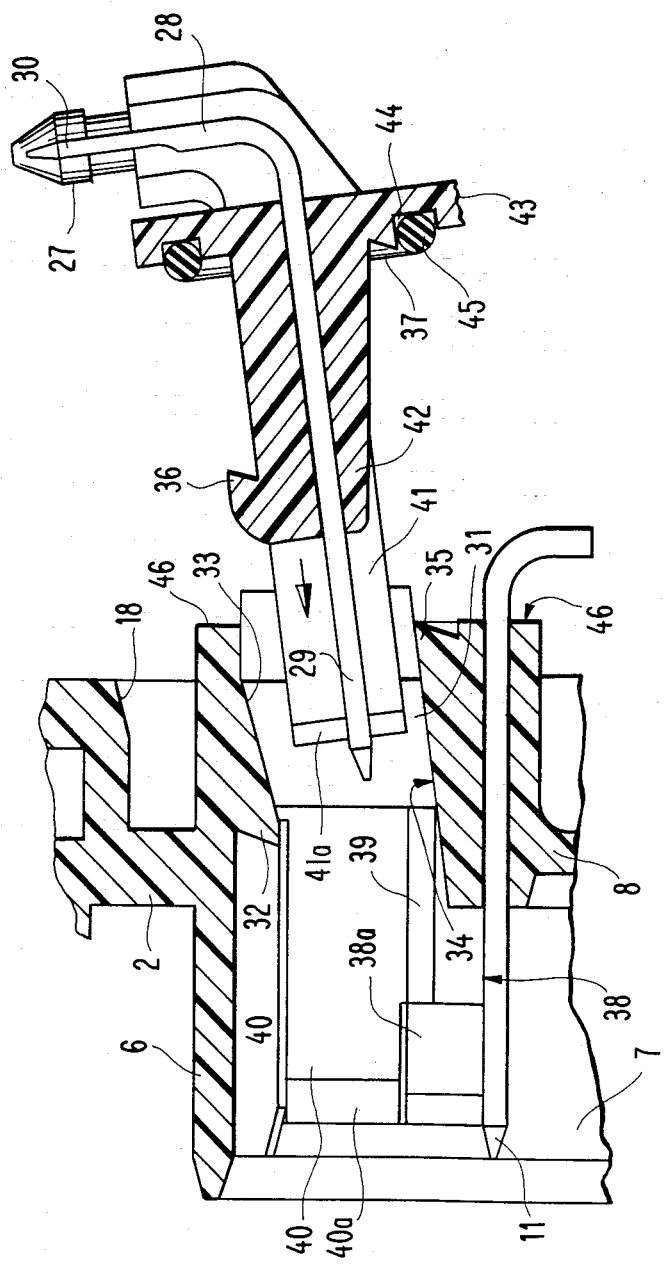
FIG. 6 is a sectional view showing how, in making an assembly illustrated in FIG. 4, the plug body part 26 is insertable into the receptacle body 2.

The electrical circuit unit shown as a whole in FIGS. 1 and 2 has a base plate 1 of metal (FIG. 2) on the front side of which there is fixed a receptacle body 2 of insulating synthetic material for holding metal parts of a multiple-contact plug device. The receptacle body 2 is provided in this embodiment with two rearwardly extending legs 3, only one of which is visible in the section shown in FIG. 2. In each leg 3 a catch pin (not shown) is formed which is lodged in a corresponding bore (likewise not shown) of the base plate 1. In a modification of this fastening arrangement shown in Fig. 4, the receptacle 2 has legs 3 having bores 4 through each of which a rivet 5 extends, by which the receptacle body 2 is riveted onto an upward dimple 1a in the base plate 1. Instead of a rivet 5 a screw may be used. A protruding guide edge 6 is formed on the receptacle body 2 which surrounds the plug region 7 dimensional for receiving the mating connector parts (not shown) of another plug connector.

One part 8 of a divided plug body 9 of elongated shape (FIG. 2) is integrated into the receptacle 2. A large number of flat connector prongs 10 are sealed tight and embedded in the part 8. The flat prongs 10 are arranged in two rows and extend their plug-in portions into the plug-in region 7 outside of the circuit unit, while their other ends are constituted as connection pins or tongues 12 (FIG. 2) and are soldered to related conducting paths, not shown in the drawings, of a first circuit board 13 inside of the circuit unit. The first circuit board 13 is fastened, in this for example, to the legs 3 of the receptacle body 2 and thereby carries the first part 8 of the plug body 9. The conducting paths of the first circuit board 13 connect the corresponding connection tongues 12 of the flat prongs 10 with the electrical/electronic components (not shown in the drawing) which are disposed on the first circuit board 13. As shown in FIG. 2, the circuit board 13, near its edge remote from the receptacle body 2, is fastened to the base plate 1 with catch studs 14. The catch studs 14 have a thick portion or bead 15 the length of which determines the spacing between the base plate 1 and the first circuit board 13.

There are so many electrical/electronic components in the circuit unit that the first circuit board 13 is not sufficient for holding all these components and their related circuit paths. Hence, the second circuit board 16 is put into the circuit unit, mounted parallel to the first circuit board 13. The second circuit board 16 is seated with an edge portion thereof in a groove 17 of the receptacle body 2. The groove 17 is provided on its upper side with an oblique insertion ramp 18 (FIG. 4). At the opposite end of the second circuit board, a connection pin 19 is provided near the edge of the board for a flat conductor 20, the pin 19 having the catch stud 21 for removable mounting (FIG. 2). The first circuit board 13 similarly has a connection pin 22 for the flat conductor 20, having a catch stud 23 inserted and held in the first circuit board 13. The ends of the flat conductor 20 thus extend into respective bores (not shown in the drawing) of the circuit boards 13 and 16 in the soldering area of conducting paths (not shown) to which they are soldered after insertion. The components on the two circuit boards 13 and 16 are thus connected directly through the flat conductor 20 in a path that is as short as possible. The connection pins 19 and 22 are also demountably connected together by a catch device having a bead 24 on a prong fitting into a socket at the end of the pin 19. A spacing shank portion 25 is provided on the pin 19 so as to hold the circuit boards 13 and 16 at a desired spacing from each other.

Near the edge of the second circuit board 16 extending into the groove 17 of the receptacle body 2 is a second part 26 (FIGS. 2 and 3) of the divided plug body 9, having a catch stud 27 formed thereon and snapped into the second circuit board 16. The way in which the plug body part 26 is inserted into place is shown in FIG. 6 where part 42 corresponds to part 26 in FIGS. 1–3. In FIG. 6 the circuit board 16 is omitted to simplify the drawing, as is also the case in FIG. 5. Flat plug-in prongs 28 are set in the part 26 of the divided plug body 9 (FIGS. 2 and 3). The prongs 28 are set all in a row, as the third prong row of the composite plug connector, embedded and sealed in the part 26 (42 in FIGS. 4–6). The plug-in portions 29 of the respective flat prongs 28 project into the plug-in region 7 of the receptacle 2, parallel to the plug-in portions 11 of the respective flat prongs 10. As shown in FIG. 4, the ends of the flat prongs 28, which form the connection tongues 30, extend in a direction opposite that in which the connection tongues 12 of the flat prongs 10 extend and do so through corresponding bores in the second circuit board 16, where they are soldered in the corresponding circuit paths. The flat prongs 28 and their connection tongues 30 are thus connected in this way for a shortest possible path to the corresponding circuit components (not shown) which are disposed on the second circuit board 16. The second part 26 of the plug body 9, as will now be explained, is releasably connected to the receptacle body 2 and thus to the first part 8 of the plug body 9 integrated into the receptacle body 2. The receptacle body 2 is provided for this purpose with an aperture 31 (FIGS. 4 and 6) where the part 42 corresponding to the part 26 of FIGS. 1–3 differs from the latter only in the provision of the seal ring 45 and its seat 44 which extends over the entire length of the first part 8 of the plug body 9 integrated into the receptacle body 2. In FIG. 1 the full lengths of the parts 8 and 26 of the divided plug body 9 are shown, but the aperture 31 is not referenced because it is filled in this view by the part 26. The upper edge of the aperture 31 is provided with a locking ridge 32 of acute angle or right angle cross-section (acute angle in the illustrated case) facing the plug-in region 7. The aperture 31 runs essentially obliquely, as shown in FIGS. 4 and 6, through the receptacle body 2 so that its upper and its lower walls form insertion ramps 33 and 34 which are more or less parallel to the insertion ramp 18 of the groove 17 for the second circuit board 16. At the lower edge of the aperture 31 facing the interior of the circuit unit, there is likewise a right-angled or acute-angled molded-in stop edge 35.

The edge of the part 42 (26 in FIG. 2) of the divided plug body 9, which edge extends into the plug-in region 7, is formed with a right-angled or acute-angled locking hook ridge 36 which grips behind the locking ridge 32 when the part 26 is fully inserted into the aperture 31. A projection 37 on the underside of the part 42 (FIGS. 4 and 6) then lies against the stop edge 35 of the receptacle body 2 on the inside of the circuit unit.

On each of the sides of the guide edge 6 of the receptacle body 2 which runs perpendicular to the plane of FIG. 5, a guide strip 38 is provided that broadens towards the middle of the plug-in region 7 into which it extends, as shown in FIG. 5. Each guide strip 38 is furthermore provided, on its side facing the aperture 31, with an oblique ramp 39, inclined so as to narrow towards the end portion 40 of the aperture 31 which is narrower than the rest of the aperture 31 in the aperture dimension illustrated in FIG. 5. The ramp 39 is molded on only at the inner portion of the guide strip 38, while the outer portion of the guide strip 38 serves as a locking edge 38a (FIG. 3 and FIG. 4).

At each of the similarly directed sides of the second part 26 of the plug body 9, a spring arm 41 (FIGS. 3–6) is molded on for locking the second part 26 of the plug body 9 when inserted into the aperture 31 of the receptacle body 2 and into the aperture end portion 40 adjoining the outer portion 38a of the guide strip 38. The circuit boards 13 and 16 are, as already mentioned, provided with conductor paths and carry circuit components to which the corresponding parts 8 and 26,42 of the plug body 9 are respectively related, the part 8 being integrated in the receptacle body 2. In the assembly of the circuit units the circuit boards are first laid one next to the other for checking and trimming the circuit and finally for soldering connections when the integrity of the circuit is assured. In this operation the circuit boards 13 and 16 are already connected together in a manner allowing them to be swung with respect to each other, the connection being made mechanically through their connection pins 19 and 22 and electronically by the flat conductor 20.

For fitting together the parts 8 and 24 or 42 to form the plug body 9, the mechanically disconnected second circuit board 16 is swung about the flat conductor 20 towards and onto the first circuit board 13. The part 26 or 42, now mounted on the second circuit board 16, as shown in FIG. 6 with the circuit board omitted to simplify the drawing, is pushed parallel to the insertion ramps 33 and 34, and thereby at an acute angle to the first circuit board 13, into the aperture 31. At the same time the edge of the second circuit board 16 comes to lie along the insertion ramp 18 in the groove 17 of the receptacle body 2. When the ridge 37 of the part 26 or 42 comes against the stop edge 35, the assembly consisting of the second circuit board 16 and second plug body part 26 or 42 is swung about the stop edge 35, so that the end of the second circuit board 16 having the connection pin 19 is moved towards the mechanial connection stud 22 and thus against the first circuit board 13 and then the locking hook 36 of the part 26 or 42 catches around the locking edge 32 at the front of the aperture 31.

The spring arms 41, which slip by the guiding strips 38 and their ramps 39 when the part 26 or 42 is inserted, can swing towards the part 26 or 42. As the part 26 swings, the spring arms slip around the stop edge 35 to swing back away from the part 26 into the end portion 40 of the aperture 31 and lock in place there against the above-mentioned locking edge 38a of the guide strip 38. The part 26 or 42 and with it is the second circuit board 16 can then no longer move parallel to the first circuit board 13 against the receptacle 2 having the first part 8 of the plug body 9 thereon, nor can it move away from the receptacle 2. The spring arms 41, now caught in the end portion 40 of the aperture 31, prevent swinging back of the part 26 or 42 and the second circuit board fastened thereto. The locking edge 38a of each molded strip portion confining the lower edge of a spring 41 prevents the plug body 42 from swinging obliquely up. The releasable part 26 of the plug body 9, itself holding the second circuit board 16, is thus locked to the receptacle body 2. Additionally, the second circuit board 16 is still releasably fastened (FIG. 2) to the first circuit board 13 through the connection pin 19 by the catch device 24 on the connection stud 22.

The spring arms 41, as shown in the drawings have their flat surfaces in a direction transverse to the direction of the flat surfaces of the plug-in prongs 10 and 28, 29.

A modified form of the releasable part of the plug body 9 is illustrated in FIGS. 4 and 5. Insofar as the parts are the same as those of the embodiment according to FIGS. 1 to 3, they are designated by the same reference numerals. FIGS. 4 and 5 have already been referred to for features common to Figs. 1-3.

The different feature of FIGS. 4 and 5 is that the releasable second part 42 of the plug body 9 shown in FIGS. 4 and 5 is provided with a flange 43 in which a seating groove 44 for a seal ring 45 is formed. The flange 43 overlaps the edges of the aperture 31 which face the interior of the circuit unit and, when the part 42 is locked in place against the seal ring 45, presses against the face 46 of the receptacle body 2 which faces the interior of the circuit unit. The parts 42 and 8 of the divided plug body 9 are thereby supplementarily sealed one against the other. The circuit unit is thus additionally sealed in the plug-in region 7.

For release of the second part 26 or 42, first the catch device 24 between the connection studs 19 and 22 is released and the spring arms 41 are swung towards each other by means of a simple tool inserted in the cavities 40a, until the arms 41 swing beyond the edge 38a and then the second circuit board 16 with the part 26 or 42 can be swung about the stop edge 35 away from the first circuit board 13. Thereafter, it is possible to draw the part 26 or 42 out of the aperture 31 of the receptacle body 2.

As a further modification it is possible to make the first part 8 of the plug body 9 separately instead of as a portion of the receptacle body 2 and to lock it to the second part 26 or 42 and insert the two as a composite component in the receptacle body 2. Similarly, more than one releasable part of the plug body 9 can be provided and then fitted together with a part 8 that is integrated in the receptacle body 2.

A cover shell 47, as shown in FIG. 2, has its bent front top edge 48 inserted in a groove while the other three sides of the cover shell 47 are laid in place with a beaded edge 50 extending around the edge of the base plate 1, thus securely closing the circuit unit. The bent edge 48 catches in the groove 49 of the receptacle body. The base plate 1, receptacle 2 and cover shell 47 together form a protective casing for the connector prongs and circuit boards of the circuit unit.

Although the invention has been described by reference to a particular illustrative embodiment and certain modifications thereof, it will be understood that other variations and modifications are possible within the inventive concept. For example, the prongs 10 and 28 can have hollow connector ends when the circuit unit is designed to have a female multiple-connection connector portion.

We claim:

1. Electrical plug-in circuit unit having a casing (1,2,47) enclosing a plurality of circuit boards (13,16) and plug-in connector part prongs (10,11; 28,29) leading out of said casing in a manner sealed thereto, comprising:

a composite plug-in connector having separate first (8) and second (26,42) plug body parts each holding some of said plug-in prong connector parts (10,11; 28,29) embedded therein;

first and second circuit boards, said first circuit board (13) being mechanically connected with said first plug body part (8) and having its circuits electrically connected to plug-in prongs (10, 11), sealed and held in said first plug body part (8) and said second circuit board (16) being mechanically connected with said second plug body part (26, 42) and having its circuits electrically connected to plug-in prongs (28, 29) sealed and held in said second plug body part, and fastening means (32, 35, 36, 37, 41) provided at least in part on said first (8) and second (26, 42) plug body parts for holding said first and second plug body parts together and permitting assembling them together with said circuit boards respectively fastened thereto.

2. Electrical plug-in circuit unit according to claim 1, in which said first (8) and second (26, 42) plug body parts are disposed at least partly within a receptacle body (2) forming part of said casing, and shaped for receiving a mating connector for making connections with said plug-in prongs held in said first and second plug body parts.

3. Electrical plug-in circuit unit according to claim 1, in which said first plug body part (8) is constituted integrally with said receptacle body (2).

4. Electrical plug-in circuit unit according to claim 1, in which said fastening means (32, 36, 35, 37, 41) for holding said first and second plug body parts together are constituted in a manner permitting separating said second plug body part (26, 42) from said first plug body part (8) after assembly of said plug-in circuit unit.

5. Electrical plug-in circuit unit according to claim 3, in which said second plug body part (26, 42) is releasably held in an aperture (31) of said receptacle body (2) adjacent to said first plug body part (8) integrated in said receptacle body (2), by said fastening means (32, 36, 35, 37).

6. Electrical plug-in circuit unit according to claim 1, in which said fastening means (32, 36, 35, 37) are interlocking catch means.

7. Electrical plug-in circuit unit according to claim 3, in which said fastening means (32, 36, 35, 37) are interlocking catch means.

8. Electrical plug-in circuit unit according to claim 5, in which said fastening means (32, 36, 35, 37) are interlocking catch means.

9. Electrical plug-in circuit unit according to claim 7, in which said second plug body part (26, 42) is equipped with spring arms (41) springing transversely to the plug-in direction of said plug-in prongs for slipping past insertion ramps (39) and for positioning said second plug body part (26, 42) in said receptacle body (2) by lying against respective locking edges (38a).

10. Electrical plug-in circuit unit according to claim 8, in which said second plug body part (26, 42) is equipped with leaf spring arms (41) springing transversely to the plug-in direction of said plug-in prongs for slipping past insertion ramps (39) and for positioning said second plug body part (26, 42) in said receptacle body (2) by lying against respective locking edges (38a).

11. Electrical plug-in circuit unit according to claim 1, in which a seal member (45) is held between said first (18) and second plug body (26, 42) parts for contributing to sealing the interior of said circuit unit.

* * * * *